United States Patent
Franklin et al.

(10) Patent No.: US 9,105,702 B2
(45) Date of Patent: Aug. 11, 2015

(54) TRANSISTORS FROM VERTICAL STACKING OF CARBON NANOTUBE THIN FILMS

(71) Applicant: International Business Machines Corporation, Armonk, NY (US)

(72) Inventors: Aaron D. Franklin, Croton on Hudson, NY (US); Joshua T. Smith, Croton on Hudson, NY (US); George S. Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 13/679,613

(22) Filed: Nov. 16, 2012

(65) Prior Publication Data

US 2014/0138623 A1 May 22, 2014

(51) Int. Cl.
| | | |
|---|---|---|
| *H01L 29/06* | (2006.01) | |
| *H01L 29/08* | (2006.01) | |
| *H01L 29/775* | (2006.01) | |
| *H01L 29/66* | (2006.01) | |
| *B82Y 10/00* | (2011.01) | |
| *B82Y 15/00* | (2011.01) | |
| *B82Y 40/00* | (2011.01) | |
| *H01L 51/00* | (2006.01) | |
| *H01L 51/05* | (2006.01) | |

(52) U.S. Cl.
CPC .............. *H01L 29/775* (2013.01); *B82Y 10/00* (2013.01); *H01L 29/66045* (2013.01); *H01L 51/0558* (2013.01); *B82Y 15/00* (2013.01); *B82Y 40/00* (2013.01); *H01L 51/0048* (2013.01); *H01L 51/0554* (2013.01)

(58) Field of Classification Search
CPC  H01L 29/786; H01L 29/66045; B82Y 99/00; C01B 31/02
USPC .......... 438/158, 157, 283; 977/712, 742, 938; 257/24, 29, E27.06, E21.616, E21.409, 257/E29.255, E51.04

See application file for complete search history.

(56) References Cited

U.S. PATENT DOCUMENTS

| | | |
|---|---|---|
| 6,933,222 B2 | 8/2005 | Dubin et al. |
| 8,124,463 B2 | 2/2012 | Chen et al. |
| 8,193,032 B2 | 6/2012 | Chen et al. |
| 8,227,799 B2 | 7/2012 | Liu et al. |

(Continued)

OTHER PUBLICATIONS

K. Ryu et al., "CMOS-Analogous Wafer-Scale Nanotube-on-Insulator Approach for Submicrometer Devices and Integrated Circuits Using Aligned Nanotubes," Nano Letters 2009, vol. 9, pp. 189-197.*

X. Ho et al., "Scaling Properties in Transistors That Use Aligned Arrays of Single-Walled Carbon Nanotubes," Nano Letters 2010, vol. 10, pp. 499-503.*

(Continued)

*Primary Examiner* — Meiya Li
*Assistant Examiner* — Peter M Albrecht
(74) *Attorney, Agent, or Firm* — Cantor Colburn LLP; Vazken Alexanian (57) ABSTRACT

A carbon nanotube field-effect transistor is disclosed. The carbon nanotube field-effect transistor includes a first carbon nanotube film, a first gate layer coupled to the first carbon nanotube film and a second carbon nanotube film coupled to the first gate layer opposite the first gate layer. The first gate layer is configured to influence an electric field within the first carbon nanotube film as well as to influence an electric field of the second carbon nanotube film. At least one of a source contact and a drain contact are coupled to the first and second carbon nanotube film and are separated from the first gate layer by an underlap region.

20 Claims, 4 Drawing Sheets

(56) References Cited

U.S. PATENT DOCUMENTS

| | | | |
|---|---|---|---|
| 8,405,189 B1 * | 3/2013 | Ward et al. | 257/532 |
| 2004/0036128 A1 * | 2/2004 | Zhang et al. | 257/401 |
| 2008/0157354 A1 | 7/2008 | Zhang et al. | |
| 2008/0272361 A1 | 11/2008 | Lim | |
| 2010/0065818 A1 * | 3/2010 | Kim et al. | 257/14 |
| 2011/0108802 A1 | 5/2011 | Lin et al. | |
| 2012/0032149 A1 | 2/2012 | Chen et al. | |

OTHER PUBLICATIONS

K. Alam, et al., "Performance Metrics of a 5 nm, Planar, Top Gate, Carbon Nanotube on Insulator (COI) Transistor." IEEE Transactions on Nanotechnology, vol. 6, Issue 2, Mar. 2007, pp. 186-190.

A. Franklin, et al., "Sub-10 nm Carbon Nanotube Transistor," 2011 IEEE International Electron Devices Meeting (IEDM), Dec. 5-7, 2011, pp. 23.7.1.-23.7.3.

* cited by examiner

TRANSISTORS FROM VERTICAL STACKING OF CARBON NANOTUBE THIN FILMS

BACKGROUND

The present invention relates to semiconductor electronics, and more specifically, to carbon nanotube field-effect transistors.

Semiconducting carbon nanotubes (CNTs) conduct high currents for their nanoscale diameters, which is on a scale of about 1 to 2 nanometers (nm). Among their many proposed uses, thin films of CNTs have shown promising results in thin-film transistor (TFTs). TFTs are larger than densely integrated metal-oxide semiconductor field-effect transistor (MOSFET) devices that dominate advanced computing. TFTs are usually used in less-advanced electronics, such as large area electronics (e.g., flat panel displays) and exotic substrates (e.g., flexible or transparent). In many cases, inkjet printing technologies are used to fabricate TFTs, including many of the TFTs that incorporate CNTs. However, the low output current of CNT TFTs limits their applicability. This low output current is a result of several factors, including high contact resistance, nanotube-nanotube junctions and low CNT density in the films.

SUMMARY

According to one embodiment of the present invention, a carbon nanotube field-effect transistor includes: a first carbon nanotube film; a first gate layer coupled to the first carbon nanotube film configured to influence an electric field within the first carbon nanotube film; a second carbon nanotube film coupled to the first gate layer opposite the first gate layer, wherein the first gate layer is configured to influence an electric field of the second carbon nanotube film; and at least one of a source contact and a drain contact coupled to the carbon nanotube films and separated from the first gate layer by an underlap region.

According to another embodiment of the present invention, a gate region of a transistor includes: a plurality of alternating layers of gate layers and carbon nanotube films; and an electrical coupling between the gate layers, wherein the carbon nanotube films are coupled to at least one of a source contact and a drain contact and the gate layers are separated from the at least one of the source contact and the drain contact by an underlap region.

According to another embodiment of the present invention, a transistor includes: a plurality of alternating layers of gate layers and carbon nanotube films; an electrical coupling device configured to couple the gate layers to each other; and at least one of a source contact and a drain contact, wherein the carbon nanotube films are configured to couple to the at least one of the source contact and the drain contact and the gate layers are configured to be separated from the at least one of the source contact and the drain contact by an underlap region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
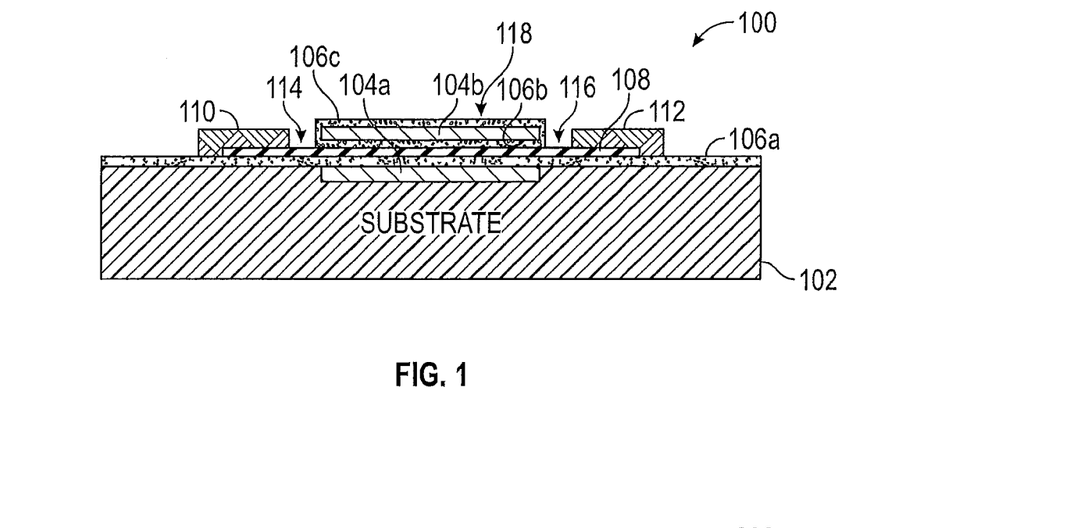
FIG. 1 shows an exemplary single layer of a gate region of an exemplary carbon nanotube transistor disclosed herein.

FIG. 1 shows an exemplary single layer of a gate region of an exemplary carbon nanotube transistor 100 disclosed herein. The gate region is formed on a substrate 102. Substrate 102 has a first gate contact metal 104a formed in a recess of the substrate 102 to form a substantially co-planar surface with the substrate 102. In exemplary embodiments, the substrate 102 is a silicon substrate. The gate contact metal 104a may be palladium or other suitable contact metal in exemplary embodiments. A dielectric layer 106a is formed on the surface of the substrate 102 and covers at least a portion of the gate contact metal 104a. The dielectric layer 106a may include hafnium oxide ($HfO_2$), $Al_2O_3$ or other suitable dielectric material. A thin film of carbon nanotubes 108 is disposed on the dielectric layer 106. The carbon nanotube film 108 extends between regions of the substrate 102 that are on opposite sides of the gate contact metal 104a. A second dielectric layer 106b is formed on top of the carbon nanotube film 108 and a second gate contact metal 104b is formed on top of the second dielectric layer 106b. A third dielectric layer 106c may be formed on top of the second dielectric layer 106b in order to form a gate layer 118 that includes the gate contact metal 104b sandwiched between the second dielectric layer 106b and the third dielectric layer 106c. Therefore, the exemplary single layer 100 includes a thin carbon nanotube film 108 surrounded by gate contact metals 104a and 104b at opposing surfaces of the carbon nanotube film 108 and separated from the gate contact metals 104a and 104b via dielectric layers 106a and 106b, respectively. The gate contact metals 104a and 104b may be electrically coupled via electrical wires or other suitable electrical coupling device or method. These gate contact metals 104a and 104b are therefore responsive to a same applied voltage, and the conductance of the carbon nanotubes of the carbon nanotube film 108 may be modulated via a voltage applied at both surfaces (i.e., top and bottom surfaces) of the carbon nanotube film 108.

A source contact 110 and a drain contact 112 may be formed on the carbon nanotube film 108 in order to complete a first layer of the CNTFET 100. The height of the source contact 110 and the drain contact 112 may be selected to be even or substantially coplanar with the top surface of the gate layer 118 assembled on top of the carbon nanotube film 108. This coplanar alignment allows the possibility of stacking a second carbon nanotube film layer on top of the completed CNTFET shown in FIG. 1, as discussed below with respect to FIG. 2.

In an exemplary embodiment, the source contact 110 and the drain contact 112 are separated from the gate layer 118 by gaps referred to herein as gate underlaps 114 and 116, respectively. An underlap refers to an ungated region between gate and source or between gate and drain. An underlap may have a length from between about 50 nanometers (nm) to about 100 nm. The presence of the gate underlaps 114 and 116 is made possible by the metallic content of the carbon nanotubes in the carbon nanotube films. While an underlap tends to produce a series resistance in the transistor, the metallic content of the CNT thin film 108 lowers the resistance in the underlap regions 114 and 116 and thus enables the CNTFET 100 to have a low parasitic capacitance.

Figure 2:
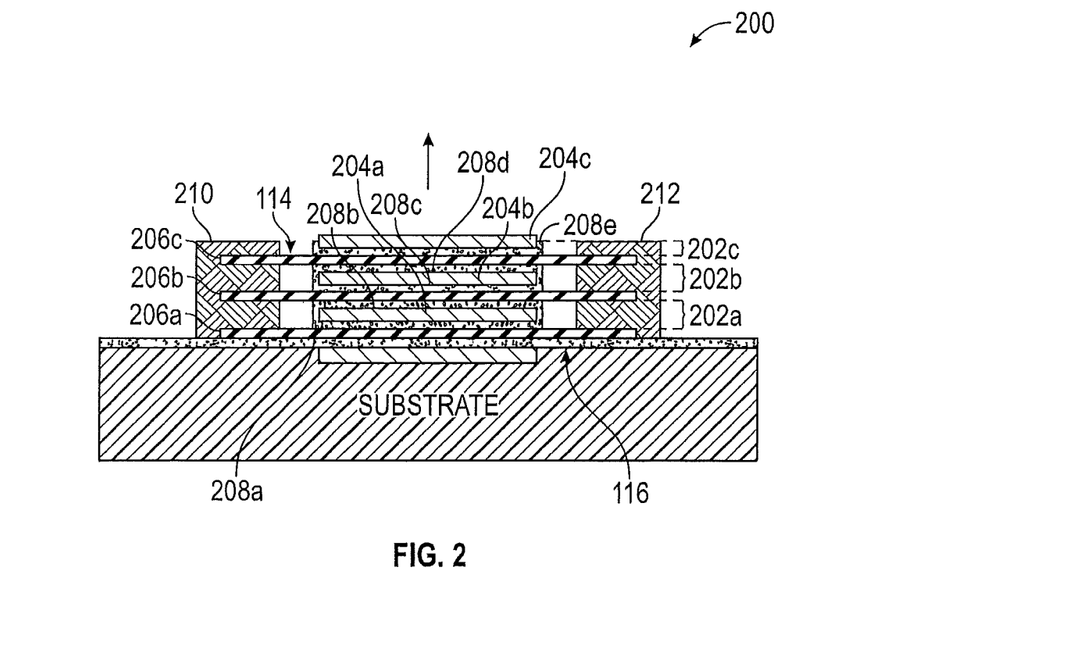
FIG. 2 shows an exemplary carbon nanotube field effect transistor (CNTFET) of the present invention that includes multiple stacked carbon nanotube films.

FIG. 2 shows an exemplary CNTFET 200 of the present invention that includes multiple stacked carbon nanotube films 206a, 206b and 206c. The exemplary CNTFET 200 includes a plurality of carbon nanotube films 206a, 206b and 206c stacked on top of each other with interleaving gate layers 202a and 202b on a substrate 102 to form a gate region. The height of the gate region is related to the number of carbon nanotube films 206a, 206b and 206c. The carbon nanotube films 206a, 206b and 206c extend between a source contact 210 and a drain contact 212 and provide multiple parallel gate channels between the source contact 210 and drain contact 212. Three carbon nanotube films 206a, 206b and 206c are shown in FIG. 2 for illustrative purposes. However, it is understood that a CNTFET formed using the methods disclosed herein may have any number of layers of carbon nanotube films. The number of carbon nanotube film layers may affect various transistor parameters, such as drain current and/or trans-conductance, for example. Thus, the number of carbon nanotube films may be selected to form a CNTFET having a parameter that is within a selected criterion. It is also understood that the number of gate layers may be increased without increasing the footprint of the transistor, i.e., the surface area of the substrate taken up by the transistor.

In the exemplary multiple-gate CNTFET 200, the plurality of carbon nanotube films 206a, 206b and 206c may be separated by interleaved gate layers such as exemplary gate layers 202a and 202b. Gate layer 202a includes a gate contact metal 204a that is sandwiched between a dielectric material 208a on one side of the gate contact metal 204b and a dielectric material 208b on an opposing side of the gate contact metal 204b. In exemplary embodiments, the dielectric materials 208a and 208b are the same material. Similarly, gate layer 202b includes gate contact metal 204b sandwiched between dielectric material 208c and dielectric material 208d. Top carbon nanotube film 206c is covered by dielectric layer 208e and gate contact metal 204c. Thus, each carbon nanotube film is surrounded by gate contact metal at each surface. In exemplary embodiments, the gate layers 202a and 202b may be electrically coupled to each other. In particular, the gate contact metals 240a, 204b and 204c may be electrically coupled to each other. The coupled gate contact metals 204a, 204b and 204c may thus be coupled to a same voltage source. Thus, a uniform voltage may be applied through each of the gate contact metals 240a, 204b and 204c. A voltage applied to a gate contact metal such as gate contact metal 204b alters an electric field in its adjacent carbon nanotube film, i.e., carbon nanotube films 206b and 206c. Additionally, a selected carbon nanotube film such as carbon nanotube film 206b may have its internal electric field affected by voltage applied at its adjacent gate contact metals, i.e., gate contact metals 204a and 204b.

Source contact 110 and a drain contact 112 may be formed by depositing suitable contact material at each layer, thereby forming a layered source contact 110 and layered drain contact 112 separated from the gate layers by underlap regions 114 and 116. In an exemplary embodiment, the gate underlaps 114 and 116 extend vertically through the layers and between the source 110 and drain 112 contacts and the gated region. While the metallic content of the CNT thin films lowers the resistance of the underlaps 114 and 116 and enables a device with low parasitic capacitance, the vertical stacking of the layers increases the output current of the stacking CNTFET over the output current of a single layer. When stacking layers, the presence of the underlaps 114 and 116 provide manufacturing tolerance that allows inaccuracy in aligning subsequent layers. Due to the presence of the underlaps 114 and 116, the layers may shift slightly without shorting to the source contact 110 or to the drain contact 112.

Figure 3:
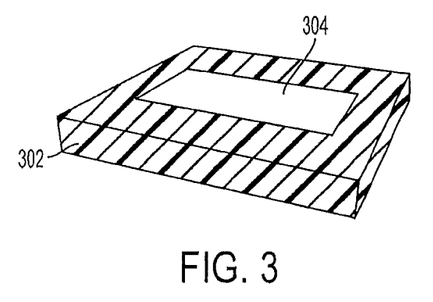
FIG. 3 shows a first manufacturing stage of the CNTFET in which a carbon nanotube film is disposed on a substrate.

FIGS. 3-8 show exemplary stages for manufacturing the multi-layer carbon nanotube field-effect transistor 200 shown in FIG. 2. FIG. 3 shows a first manufacturing stage of the CNTFET 200 in which a carbon nanotube film 304 is disposed on a substrate 302, such as a silicon dioxide substrate. The substrate is typically 1 micrometer (μm) in thickness. The carbon nanotube film 304 may be grown independently and then transferred onto the silicon substrate 302. Alternatively, the CNT thin films may be deposited using solution-based dispersion techniques. In the dispersion technique, the CNT film may not be well-aligned. However, the dispersion film may be patterned directly onto the gate region without the need for an etching removal step. The carbon nanotube film 304 may include an arrangement of twisted carbon nanotubes. The carbon nanotubes may be semiconductor carbon nanotubes but may contain a selected amount of metallic carbon nanotubes. In one embodiment, the amount of metallic carbon nanotubes may be selected to meet a selected criterion. A resist (not shown) may then be formed on the carbon nanotube film 304 and the silicon substrate 102 to protect a segment of the initial carbon nanotube film from lithographic process that patterns the carbon nanotube film for the active transistor device. In an exemplary embodiment, the resist may include a bilayer resist of hydrogen silsesquioxane (HSQ 2%) on poly(methylmethacrylate) (PMMA). Electron beam lithography (EBL) may then be used to pattern the bilayer resist to form a mask. A reactive ion etch may be used to remove carbon nanotube film in the exposed region. The etching process leaves the carbon nanotube film 304 as shown in the FIG. 3.

Figure 4:
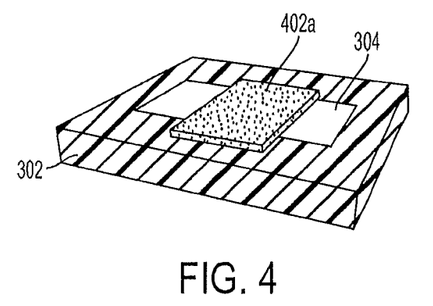
FIG. 4 shows a second stage of the manufacturing process in which a dielectric material is formed on the carbon nanotube film.

FIG. 4 shows a second stage of the manufacturing process in which a dielectric material is formed on the carbon nanotube film 304. The dielectric layer 402a may be formed by a method of resist deposition, lithography, atomic layer deposition of a dielectric material and resist take off. In an exemplary embodiment, electron beam lithography is used to pattern a region of the exposed carbon nanotube film 304. After the region is exposed, trimethylaluminum (TMA) and water precursors in $NO_2$ may be deposited on the carbon nanotube film to form a seed layer. In an exemplary embodiment, the TMA and water precursor in $NO_2$ are deposited over a 10 cycle deposition process. Once the seed layer is formed, atomic layer deposition may be used to form a dielectric layer of hafnium oxide ($HfO_2$), $Al_2O_3$ or other suitable high-k dielectric material. In an exemplary embodiment, the dielectric layer has a thickness of about 10 nm.

Figure 5:
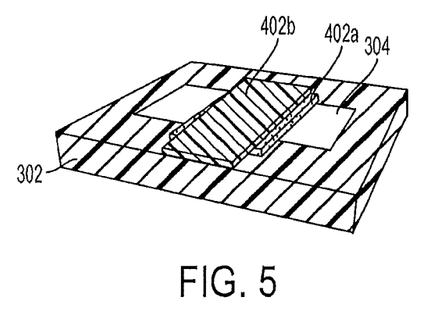
FIG. 5 shows a third stage of the manufacturing process in which gate contact metal is formed on the dielectric layer of FIG. 4.

FIG. 5 shows a third stage of the manufacturing process in which gate contact metal 402b is formed on the dielectric layer 402a of FIG. 4. The gate contact metal 402b may be formed by resist deposition, lithography, atomic layer deposition of the gate contact metal and resist take-off using hot acetone. In an exemplary embodiment, the metal of the gate contact metal 402b may be palladium or other suitable contact material. In an exemplary embodiment, the gate contact metal 402b has a thickness of about 10 nm.

Figure 6:
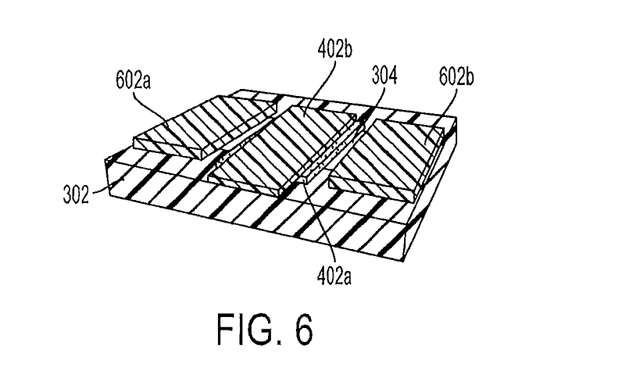
FIG. 6 shows a fourth stage of the manufacturing process in which a source and drain contacts are formed.

FIG. 6 shows a fourth stage of the manufacturing process in which a source 602a and drain 602b contacts are formed. Source 602a and drain 602b may be formed by forming a resist layer on the substrate, using electron beam lithography on the resist layer to expose a region. A metal is then deposited in the exposed region to form the source 602a and the drain 602b using, for example, atomic layer deposition. The source 602a and drain 602b are formed so as to be electrically coupled to the carbon nanotube film 304. In an exemplary embodiment, the metal used in the source 602a and drain 602b is palladium (Pd), although any suitable metal may be used. In an exemplary embodiment, the thickness of the source 602a and drain 602b is about 30 nanometers (nm), although any suitable thickness may be used. After the atomic layer deposition of the source 602a and drain 602b, the resist layer is lifted off of the substrate using, for example, hot acetone. The transistor that is formed after this fourth stage is equivalent to a top-gated CNTFET. This top-gated CNTFET may be tested after the fourth stage and before continuing the manufacturing process.

Figure 7:
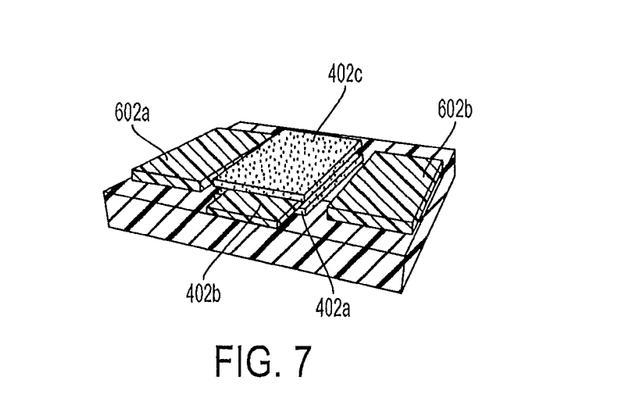
FIG. 7 shows a fifth stage of the manufacturing process in which a second dielectric layer is deposited on the gate contact metal shown in FIG. 6.

FIG. 7 shows a fifth stage of the manufacturing process in which a second dielectric layer 402c is deposited on the gate contact metal 402b shown in FIG. 6. Deposition of the second dielectric layer 402c completes formation of a gate layer of the multi-level CNTFET, such as exemplary gate layer 102a. The process for forming the second dielectric layer is similar to the process of forming the first dielectric layer shown in FIG. 4. The second dielectric layer may include hafnium oxide or other suitable dielectric material. In an exemplary embodiment, the second dielectric layer 402c has a thickness of about 10 nm.

The gate layer 102a thus comprises first dielectric layer 402a having a thickness of 10 nm, gate contact metal 402b having a thickness of 10 nm and second dielectric layer 402c having a thickness of 10 nm. Therefore, the thickness of the gate layer 102 is approximately 30 nm and is the same thickness as the source 602a and drain 602b. The top surfaces of the gate layer 102a, the source 602a and the drain 602b therefore form substantially coplanar surfaces that may be used for further carbon nanotube film deposition and transistor growth. The second dielectric layer 402c may be made to be a suitable thickness during the fifth stage in order to achieve a coplanar surface with the source 602a and drain 602b.

Figure 8:
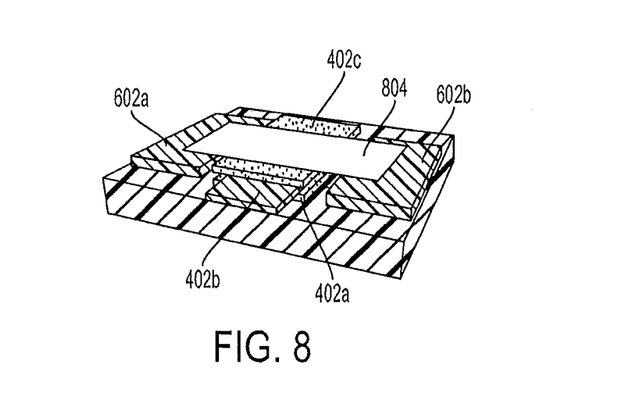
FIG. 8 shows a sixth stage of the manufacturing process in which a second carbon nanotube film of the CNTFET is formed.

FIG. 8 shows a sixth stage of the manufacturing process in which a second carbon nanotube film 804 of the CNTFET 200 is formed. The second carbon nanotube film 804 may be formed using the same process as the first carbon nanotube film of FIG. 1. In other words, a CVD-grown carbon nanotube material is deposited on the surfaces provided by the gate layer 102, the source 602a and drain 602b and etched to a selected dimension to provide the second carbon nanotube film 804. The second carbon nanotube film 804 is formed so as to be electrically coupled to the source 602a and the drain 602b. At the end of the sixth stage, there are two independent, vertically stacked carbon nanotube films 304 and 804 that are gated by the same gate contact metal 402b and in contact with the same source 602a and same drain 602b. The presence of the second carbon nanotube film 804 enhances a performance characteristic of the CNTFET while maintaining a footprint of the CNTFET at the substrate, i.e., without increasing the surface area required by the CNTFET at the substrate 102.

Figure 9:
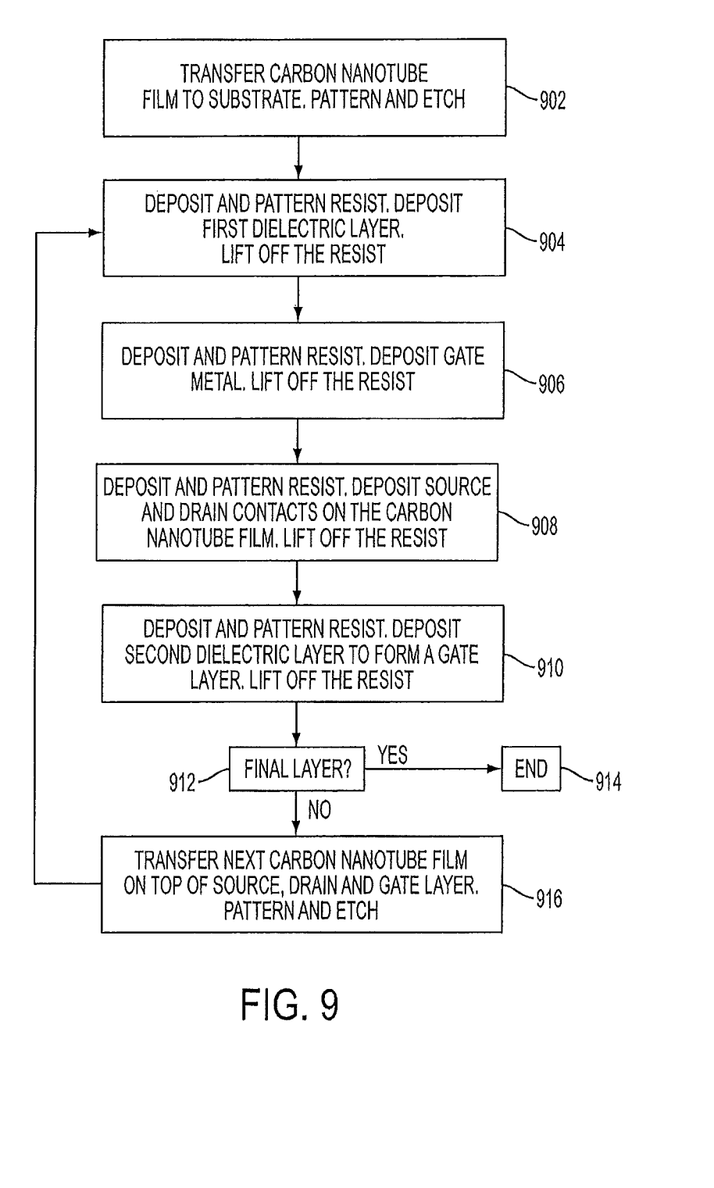
FIG. 9 shows a flowchart illustrating an exemplary method of forming the CNTFET of the present invention.

FIG. 9 shows a flowchart 900 illustrating an exemplary method of forming the CNTFET of the present invention. In block 902, a carbon nanotube film is transferred to a substrate and patterned and etched to form a first carbon nanotube film of the CNTFET that provide a gate channel of the CNTFET. In block 904, the first dielectric layer is formed on the first carbon nanotube film. In an exemplary embodiment, a resist is deposited and patterned to expose and area of the first carbon nanotube film. A dielectric material is deposited in the patterned area of the resist to form the first dielectric layer and the resist is lifted off. In block 906, a gate contact metal is deposited on the first dielectric layer. In an exemplary embodiment, a resist is deposited and patterned to expose the first dielectric layer. The gate contact metal is then deposited on the exposed first dielectric layer and the resist is lifted off. In block 908, source and drain contacts are formed on the first carbon nanotube film at locations that provides underlap regions. In an exemplary embodiment, a resist is deposited and patterned. Metals are then deposited in the patterned area of the resist to form the source and drain contacts and the resist is lifted off. In block 910, a second dielectric layer is deposited on the gate contact metal formed in block 908. In an exemplary embodiment, a resist is deposited and patterned to expose at least a portion of the gate contact metal. A dielectric material is deposited on the exposed portion of the gate contact metal to form the second dielectric layer and the resist is lifted off. At this point an operable gate channel has been completed. Therefore, in block 912, an operator determines whether the most recently completed gate channel is the last gate channel of the CNTFET to be formed. This decision is generally based on a design specification selected by the operator. If this is the final gate channel, the process proceeds to block 914 where it ends. Otherwise, a second carbon nanotube film is transferred to the substrate to lie on top of the gate channel formed in blocks 906, 908 and 910 as well as on top of the source and drain contacts formed in block 904. This second carbon nanotube film forms a second gate channel of the CNTFET parallel to the first gate channel. From block 916, the process returns to block 904 and more layers are deposited to form the next layer of gate channels. This process may be continued to form any number of gate channels. Once the final gate channel is completed, the gate contact metals may be electrically coupled using, for example, a wire connection or bonding method.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for exemplary embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a carbon nanotube field-effect transistor, comprising:
    forming a first carbon nanotube film;
    forming a first gate structure on a surface of the first carbon nanotube film to influence an electric field of the first carbon nanotube film;
    forming a source contact and a drain contact on the first carbon nanotube film, wherein at least one of the source contact and the drain contact is separated from the first gate structure by an underlap region; and
    forming a second carbon nanotube film directly on the first gate structure, the source contact and the drain contact, wherein the first gate structure influences an electric field of the second carbon nanotube film, and wherein a bottom surface of the second carbon nanotube film is substantially coplanar with a top surface of the first gate structure, a top surface of the source contact and a top surface of the drain contact.

2. The method of claim 1, further comprising forming a second gate structure on the second carbon nanotube film and electrically coupling the first gate structure and the second gate structure.

3. The method of claim 2, further comprising forming the second gate structure on the second carbon nanotube film to influence the electric field of the second carbon nanotube film using both of the first gate structure and the second gate structure.

4. The method of claim 1, wherein forming the first gate structure further comprises:
    forming a first dielectric layer;
    forming a gate contact metal on the first dielectric layer; and
    forming a second dielectric layer on the gate contact metal.

5. The method of claim 1, wherein a metallic content of at least one of the first carbon nanotube film and the second carbon nanotube film lowers a contact resistance of the underlap region.

6. The method of claim 1, wherein a thickness of the first gate structure is substantially the same as a thickness of the at least one of the source contact and the drain contact.

7. The method of claim 1, further comprising alternately stacking additional carbon nanotube films and additional gate structures to obtain a selected state of a parameter of the transistor.

8. A method of forming a gate region of a transistor, comprising:
    stacking a plurality of alternating layers of contact structures and carbon nanotube films,
    wherein forming each of the contact structures comprises:
        forming a gate structure, a source contact and a drain contact on a surface of a respective one of the carbon nanotube films,
        wherein at least one of the source contact and the drain contact is separated from the gate structure by an underlap region, and
        wherein a top surface of the gate structure, a top surface of the source contact and a top surface of the drain contact are substantially coplanar; and
    electrically coupling the gate structure of each of the contact structures to each other to form the gate region of the transistor.

9. The method of claim 8, wherein stacking the plurality of alternating layers of the contact structures and the carbon nanotube films further comprises vertically stacking the plurality of alternating layers of the contact structures and the carbon nanotube films on a substrate.

10. The method of claim 9, wherein a footprint of the transistor on the substrate is independent of a number of the alternating layers.

11. The method of claim 8, wherein an electric field in the respective one of the carbon nanotube films is affected by the gate structure of an adjacent one of the contact structures.

12. The method of claim 8, wherein a metallic content of the carbon nanotube films lowers a contact resistance of the underlap region.

13. The method of claim 8, wherein forming the gate structure further includes:
    forming a first dielectric layer;
    forming a gate contact metal on the first dielectric layer; and
    forming a second dielectric layer on the gate contact metal.

14. The method of claim 8, further comprising selecting a number of the alternating layers to obtain a selected state of a transistor parameter.

15. A method of forming a transistor, comprising:
    stacking a plurality of alternating layers of contact structures and carbon nanotube films,
    wherein forming each of the contact structures comprises:
        forming a gate structure, a source contact and a drain contact on a surface of a respective one of the carbon nanotube films,
        wherein at least one of the source contact and the drain contact is separated from the gate structure by an underlap region, and
        wherein a top surface of the gate structure, a top surface of the source contact and a top surface of the drain contact are substantially coplanar; and
    electrically coupling the gate structure of each of the contact structures to each other.

16. The method of claim 15, wherein stacking the plurality of alternating layers of the contact structures and the carbon nanotube films further comprises vertically stacking the plurality of alternating layers of the contact structures and the carbon nanotube films on a substrate.

17. The method of claim 15, wherein an electric field in the respective one of the carbon nanotube films is affected by the gate structure of an adjacent one of the contact structures.

18. The method of claim 15, wherein forming the gate structure further includes:
 forming a first dielectric layer;
 forming a gate contact metal on the first dielectric layer; and
 forming a second dielectric layer on the gate contact metal.

19. The method of claim 15, wherein a thickness of the gate structure is substantially the same as a thickness of the at least one of the source contact and the drain contact.

20. The method of claim 15, further comprising selecting a number of the alternating layers to obtain a selected state of a transistor parameter.

\* \* \* \* \*